United States Patent [19]

Walls

[11] 3,954,472
[45] May 4, 1976

[54] SUBTRACTIVE DEVELOPER FOR NEGATIVE WORKING LITHOGRAPHIC PLATES

[75] Inventor: John E. Walls, Ridgely, Md.
[73] Assignee: S. O. Litho Corporation, Easton, Md.
[22] Filed: Aug. 26, 1974
[21] Appl. No.: 500,475

[52] U.S. Cl. .......................... 96/49; 96/33
[51] Int. Cl.² .................. G03F 7/02; G03C 5/34
[58] Field of Search ........................ 96/33, 49

[56] References Cited
UNITED STATES PATENTS

| | | | |
|---|---|---|---|
| 3,669,660 | 6/1972 | Golda et al. | 96/49 |
| 3,738,850 | 6/1973 | Radell et al. | 96/33 |

OTHER PUBLICATIONS

Kodak Databook–Processing, Chemicals & Formulas, 1954 (Fifth ed.)–"Reduces" pp. 56–59.

*Primary Examiner*—David Klein
*Assistant Examiner*—L. V. Falasco
*Attorney, Agent, or Firm*—Patalidis & Dumont Hauke

[57] ABSTRACT

A subtractive developer for negative working lithographic plates comprising an aqueous solution of an alcohol, preferably n-propanol, a small quantity of ammonium sulfite, and polyvinylpyrolidone in the range of 0.05 – 0.12% by weight. The developer may also contain a small quantity of ammonium sulfate or ammonium chloride.

6 Claims, No Drawings

SUBSTRACTIVE DEVELOPER FOR NEGATIVE WORKING LITHOGRAPHIC PLATES

BACKGROUND OF THE INVENTION

This invention relates to subtractive developers for lithographic plates and more particularly to a subtractive developer for lithographic plates of the wipe-on type as well as of the presensitized type, utilizing a coating of diazo resin on a substrate.

The purpose of a subtractive developer is to adequately desensitize the background area while, at the same time, leaving the image area unaffected. The developer should also provide a coating of gum to protect the background area.

If the developer does not desensitize completely the unexposed diazo resin in the background area, the background area, during use of the developed plate in a printing press or during storage of the plate, may be accidentally sensitized resulting in smudging of the background. Further requirements for an effective subtractive developer for negative working lithographic plates are that it be relatively fast in action such that the plate may be developed preferably in a few seconds, that it require no additional gumming of the plates after development, that it be relatively stable during storage such as to be provided with a reasonably practical shelf life, and that it not be subject to producing noxious or disagreeable fumes and odors during use.

A further requirement for a lithographic plate subtractive developer, due to the now quite prevalent use of automatic developing machines, is that the developer be free of noxious and corrosive effects upon the metallic parts of the developing machine and more particularly upon the copper plumbing generally in use in such apparatus.

All those requirements are fulfilled by the developer of the present invention which may be safely used in automatic lithographic plate developing machines, which is relatively fast acting, which does not release any obnoxious or undesirable fumes and odors, which is effective in appropriately desensitizing and gumming the background areas of a lithographic plate without affecting the image areas, and which is endowed with a long shelf life.

SUMMARY

The present invention accomplishes its objects by providing a simple subtractive developer solution for negative working lithographic plates in the form of an aqueous solution of an alcohol, preferably n-propanol, containing a small quantity of ammonium sulfite and polyvinylpyrolidone, the ammonium sulfite providing the desensitizing agent for the unexposed diazo resin of the plates and the polyvinylpyrolidone providing the gumming agent.

DETAILED DESCRIPTION OF THE PREFERRED EMBODIMENT

Diverse solutions of subtractive developers for negative working lithographic plates were prepared according to the formulations of the following examples.

The developer solutions of the invention were used for hand- and for machine-development of photo lithographic plates of diverse manufactures, exposed in a conventional manner. After development, the plates were placed in a printing press and used for running several thousand print copies.

The efficiency of the developer in every case was tested by re-exposing the plates to uniform light of the same illumination as used for the original exposure, but without a mask, for periods of time up to sixty seconds and by redeveloping and running the plate in the printing press. In every case it was noted that copies were printed without any smudging or scumming of the background area, thus demonstrating clearly that the background area of the plates had been effectively desensitized.

As an alternative to such a test, developed plates were dried and stored for several days without gum. After several days of storage, the plates were placed on a printing press and run in a normal manner. It was noted that roll-up with ink occurred within three revolutions of the inking roller, and perfect prints were obtained without any of the plate background being affected by the storage nor subject to scumming.

The diverse developer solutions of the invention were subjected to accelerated aging by maintaining them at a room temperature of 50°C for a period of 22 days. At the end of the 22 day period, the developers were used for developing lithographic plates in the usual manner and were found to be as effective as on the first day of storage. It is estimated that storing the developers for 22 days at 50°C is conservatively the equivalent of storing the developers at room temperature for at least 6 months.

After being aged for 22 days at 50°C, batches of developers according to the following examples were stored at 60°C. Plates were then developed every day using the aged developers. It was noted that when a plate was developed with a developer when still hot, the plate became scummed, but if the developer was left to cool to room temperature, the developed plate was perfect and did not scum, even when re-exposed.

After 18 days of storage at 60°C, the developers were found to still develop plates in a very effective manner, but when the plates were re-exposed the background area scummed.

From those accelerated aging tests, it was concluded that the developers according to the present invention have a safe shelf life of at least 2 years, and a practical shelf life of at least 2½ years, when stored at room temperature.

EXAMPLE I

A subtractive developer for negative working lithographic plates was prepared according to the following composition:

101.6 gr. $H_2O$ (distilled)
93.6 gr. n-propanol
3.7 gr. ammonium sulfite $(NH_4)_2SO_3$
0.2 gr. PVP (polyvinylpyrolidone)

This developer, therefore, had the following composition in percent by weight:

| | |
|---|---|
| $H_2O$ (distilled) | 51.02 % by weight |
| n-propanol | 47.00 % by weight |
| $(NH_4)_2SO_3$ | 1.86 % by weight |
| PVP | 0.12 % by weight |

EXAMPLE II

A subtractive developer for negative working lithographic plates was prepared according to the following composition:

152.4 gr. H₂O (distilled)
140.4 gr. n-propanol
55.5 gr. (NH₄)₂SO₃, ammonium sulfite
18.0 gr. (NH₄)₂SO₄, ammonium sulfate
3.0 gr. PVP (polyvinylpyrolidone)

This developer, therefore, had the following composition in percent by weight:

| | |
|---|---|
| H₂O (distilled) | 50.80 % by weight |
| n-propanol | 46.80 % by weight |
| (NH₄)₂SO₃ | 1.85 % by weight |
| (NH₄)₂SO₄ | 0.90 % by weight |
| PVP | 0.10 % by weight |

EXAMPLE III

A subtractive developer for negative working lithographic plates was formulated having the following composition by weight:

| | |
|---|---|
| H₂O (distilled) | 47.65 % by weight |
| n-propanol | 49.39 % by weight |
| (NH₄)₂SO₃ | 2.45 % by weight |
| NH₄Cl (ammonium chloride) | 0.46 % by weight |
| PVP | 0.05 % by weight |

The developers having the formulations of Example I, Example II and Example III, were used for developing diverse negative working lithographic plates, as explained hereinbefore, and successfully subjected to the aging tests as also explained hereinbefore.

The speed of development of the solutions was about equal. However, the solution according to Example III was slightly faster in action than the developers according to the formulations of Examples I and II. All lithographic plates were developed with a good density of background, and full development was achieved in approximately 25–30 seconds.

For the purpose of ascertaining the influence of the proportions of n-propanol, ammonium sulfite and polyvinylpyrolidone in the formulation of the developer, diverse developers were prepared within the following range of variations in formulation:

EXAMPLE IV

| | percent by weight |
|---|---|
| n-propanol | 10 – 90 |
| (NH₄)₂SO₃ | 0.70 – 3.00 |
| NH₄Cl | 0.50 |
| PVP (polyvinylpyrolidone) | 0.12 – 0.05 |
| H₂O (distilled) | balance |

Tests of diverse concentrations of the variable constituents revealed the following results:

While maintaining the proportions of all the other constituents constant, a decrease in the concentration of polyvinylpyrolidone from 0.12 to 0.05 % by weight produced the same results while using the lithographic plate on the printing press. The background remained clean throughout a long run. However, the image was faster rolling while using the lower concentration of PVP, and a better image was maintained throughout the run. For this reason alone, it was found preferable to use the lower concentration of 0.05 % by weight of PVP. Below that concentration, the quality of the copies deteriorated rapidly on printing a predetermined number of copies, such as 60,000 copies.

By varying the concentration of ammonium sulfite within the range indicated, it was found that any concentration above 0.7 % by weight was sufficient to fully develop a plate with complete desensitizing of the background area. It was also found that concentration above 3% by weight resulted in a waste of material. However, concentrations of about 2.45 to 2.50 % by weight are apparently preferable for providing the developer with a reasonable development speed as well as for providing a wide safety margin during aging of the developer.

Ammonium chloride has no effect on the ability of the developer to desensitize the unexposed background areas of the plates. However, the presence of ammonium chloride in the developer increases its speed, and a concentration of 0.46 to 0.50 % by weight has been found sufficient for that purpose.

n-propanol serves to reduce surface tension, and permit the solution to work into the grain of the lithographic plate substrate. n-propanol also dissolves the unexposed diazo coating which may be on the plate surface. The concentration of n-propanol may vary considerably, and quantities as small as 10% by weight and as much as 90% by weight of n-propanol have been found to be effective. However, optimum concentrations of n-propanol between 45 and 55% by weight are apparently preferable, because a proportion of n-propanol lower than 45% by weight reduces the speed of the developer such that more development time is required which, for some applications where development time is an important factor, is somewhat undesirable. When using a concentration of more than 55% by weight of n-propanol, the speed of the developer does not appreciably improve.

Other alcohols, such as ethanol, methanol, isopropanol, butanol, etc., were substituted for n-propanol and provided acceptable developer solutions in the preferred proportions of constituents. However, as compared to the presence of another alcohol in the same proportion, n-propanol accomplishes the best results as to speed of development, complete desensitizing of the background area, maintenance of an image of quality throughout a long printing run, facility of inking on the press, avoidance of smudging of the background area or bleeding of the image area into the background area, preservation of the developed plate under normal storage conditions, and aging of the developer solutions.

For those reasons, the preferred formulation range for the developer of the invention is as follows:

EXAMPLE V

| | percent by weight |
|---|---|
| n-propanol | 45 – 55 |
| (NH₄)₂SO₃ | 0.70 – 3.00 |
| NH₄Cl (ammonium chloride) | 0.46 |
| PVP (polyvinylpyrolidone) | 0.10 – 0.05 |
| H₂O (distilled) | balance |

The subtractive developer of the invention is prepared by first dissolving the predetermined amount of ammonium sulfite and ammonium chloride in the water. The water is distilled water, from which ions have been removed. If ionized water is used, the shelf life of the developer is considerably reduced as the ions, particularly chlorine, oxidize the ammonium salts in the solution.

Polyvinylpyrolidone, in an appropriate proportion, is dissolved in an appropriate predetermined quantity of n-propanol. The two solutions are then mixed, and the developer solution is ready for storage in bottles.

In addition to being endowed with all the advantages hereinbefore indicated, the developer solution of the invention has no effect on copper or bronze parts and piping used in automatic lithographic plate developing machines.

Having thus described the present invention by way of specific examples of formulation thereof, variations and modifications whereof will be apparent to those skilled in the art, what is claimed as new is as follows:

1. A subtractive developer for negative working lithographic plates comprising a diazo resin photosensitive material on a substrate, said developer comprising an alcohol in the range of 10 – 90% by weight, ammonium sulfite in the range of 0.70 – 3.00% by weight, polyvinylpyrolidone in the range of 0.05 – 0.12% by weight, and distilled water for the balance by weight.

2. The subtractive developer of claim 1 wherein said alcohol is n-propanol.

3. The subtractive developer of claim 2 wherein said n-propanol is in the range of 45 – 55% by weight.

4. The subtractive developer of claim 3 wherein said polyvinylpyrolidone is in the range of 0.05 – 0.10% by weight.

5. The subtractive developer of claim 4 further comprising about 0.5 % by weight of ammonium chloride.

6. The subtractive developer of claim 5 wherein the proportion of said ammonium sulfite is about 2.5 % by weight.

* * * * *